United States Patent
Di Stefano et al.

(10) Patent No.: US 7,849,914 B2
(45) Date of Patent: Dec. 14, 2010

(54) COOLING APPARATUS FOR MICROELECTRONIC DEVICES

(75) Inventors: Peter T. Di Stefano, San Jose, CA (US); Thomas H. Di Stefano, Monte Sereno, CA (US)

(73) Assignee: Clockspeed, Inc., San Jose, CA (US)

( * ) Notice: Subject to any disclaimer, the term of this patent is extended or adjusted under 35 U.S.C. 154(b) by 1230 days.

(21) Appl. No.: 11/415,901

(22) Filed: May 2, 2006

(65) Prior Publication Data

US 2007/0256810 A1  Nov. 8, 2007

(51) Int. Cl.
*F28F 7/00* (2006.01)
*H05K 7/20* (2006.01)

(52) U.S. Cl. ........................................ 165/46; 165/80.4

(58) Field of Classification Search ................ 165/80.3, 165/185, 104.33, 104.34, 46, 80.4; 361/702, 361/703, 704, 699; 257/718–720
See application file for complete search history.

(56) References Cited

U.S. PATENT DOCUMENTS

| | | | | |
|---|---|---|---|---|
| 4,193,445 A | * | 3/1980 | Chu et al. | 165/79 |
| 4,226,281 A | | 10/1980 | Chu | 165/80 |
| 4,235,283 A | | 11/1980 | Gupta | 165/80 |
| 4,381,032 A | * | 4/1983 | Cutchaw | 165/46 |
| 4,468,717 A | | 8/1984 | Mathias et al. | 361/382 |
| 4,500,945 A | | 2/1985 | Lipschutz | 361/386 |
| 4,639,829 A | | 1/1987 | Ostergren et al. | 361/386 |
| 4,685,211 A | | 8/1987 | Hagihara et al. | 29/832 |
| 4,693,303 A | | 9/1987 | Okada | 165/80.4 |
| 4,721,996 A | | 1/1988 | Tustaniwskyj et al. | 357/82 |
| 4,729,060 A | | 3/1988 | Yamamoto et al. | 361/385 |
| 4,730,665 A | * | 3/1988 | Cutchaw | 165/80.4 |
| 4,730,666 A | | 3/1988 | Flint et al. | 165/80.4 |
| 4,748,495 A | | 5/1988 | Kucharek | 357/82 |
| 4,750,086 A | | 6/1988 | Mittal | 361/382 |
| 4,783,721 A | | 11/1988 | Yamamoto et al. | 361/382 |
| 4,794,981 A | | 1/1989 | Mizuno | 165/80.4 |
| 4,800,956 A | | 1/1989 | Hamburgen | 165/185 |
| 4,847,731 A | | 7/1989 | Smolley | 361/385 |
| 4,854,377 A | | 8/1989 | Komoto et al. | 165/80.4 |
| 4,879,629 A | | 11/1989 | Tustaniwskyj et al. | 361/385 |

(Continued)

OTHER PUBLICATIONS

"Thermal Conduction Module Cooling" IBM Tech Disc. Bull. p. 531, Jul. 1983.

(Continued)

*Primary Examiner*—Tho v Duong
(74) *Attorney, Agent, or Firm*—Michael B. Einschlag

(57) ABSTRACT

One embodiment of the present invention is an apparatus for cooling a microelectronic device including: (a) a rigid support ring having a top surface and a bottom surface; (b) a mechanically resilient, thermally conductive bottom membrane having a top and a bottom surface, wherein the top surface of the membrane is attached to the bottom surface of the ring; and (c) a multiplicity of thermally conductive posts having top and bottom surfaces, the posts being disposed with their bottom surfaces in thermal contact with the top surface of the bottom membrane over an area, wherein the posts are arrayed in the area with spaces therebetween so that heat transferred from the microelectronic device to the bottom surface of the membrane may be transferred to the multiplicity of thermally conductive posts.

23 Claims, 7 Drawing Sheets

U.S. PATENT DOCUMENTS

| | | | | |
|---|---|---|---|---|
| 4,884,167 | A | | 11/1989 | Mine .......................... 361/382 |
| 4,884,169 | A | | 11/1989 | Cutchaw ...................... 361/385 |
| 4,933,747 | A | * | 6/1990 | Schroeder ................... 257/714 |
| 4,938,279 | A | | 7/1990 | Betker .......................... 165/46 |
| 4,942,497 | A | | 7/1990 | Mine et al. .................. 361/385 |
| 4,964,458 | A | | 10/1990 | Flint et al. ................. 165/80.4 |
| 5,022,462 | A | * | 6/1991 | Flint et al. ................. 165/80.4 |
| 5,083,373 | A | | 1/1992 | Hamburgen .............. 29/890.03 |
| 5,168,348 | A | * | 12/1992 | Chu et al. .................... 257/713 |
| 5,228,502 | A | * | 7/1993 | Chu et al. .................. 165/80.4 |
| 5,349,823 | A | | 9/1994 | Solomon .......................... 62/6 |
| 5,360,993 | A | | 11/1994 | Mine .......................... 257/714 |
| 5,388,635 | A | | 2/1995 | Gruber et al. .............. 165/80.4 |
| 5,517,753 | A | | 5/1996 | Messina ....................... 29/841 |
| 5,586,005 | A | | 12/1996 | Cipolla et al. ................ 361/719 |
| 5,706,171 | A | | 1/1998 | Edwards et al. ............. 361/705 |
| 5,719,443 | A | | 2/1998 | Messina ...................... 257/712 |
| 5,881,945 | A | | 3/1999 | Edwards et al. .......... 228/124.6 |
| 5,918,665 | A | | 7/1999 | Babcock et al. ........ 165/104.33 |
| 5,982,038 | A | | 11/1999 | Toy et al. ..................... 257/772 |
| 6,317,326 | B1 | | 11/2001 | Vogel et al. .................. 361/704 |
| 6,373,133 | B1 | | 4/2002 | DiGiacomo et al. ......... 257/713 |
| 6,392,431 | B1 | * | 5/2002 | Jones .......................... 324/760 |
| 6,528,878 | B1 | | 3/2003 | Daikoku et al. ............. 257/714 |
| 6,587,345 | B2 | * | 7/2003 | Chu et al. .................... 361/719 |
| 7,079,393 | B2 | * | 7/2006 | Colgan et al. ............... 361/699 |
| 2004/0207985 | A1 | * | 10/2004 | Delano et al. ............... 361/704 |

OTHER PUBLICATIONS

"Thermal Conduction Module with Finned Pistons Having Star-Shaped or Gear-Like Upper Section" IBM Tech Disc. Bull. pp. 6869-6870, May 1985.

"Thermal Conduction Module with Spring Sturcture Holding Cold Plate to Hat" IBM Tech Disc. Bull. p. 3214, Dec. 1985.

"Thermal Conduction Module with Wetted Interface Between Hat and Cold Plate Established . . . " IBM Tech Disc. Bull. p. 750, Jul. 1986.

"Thermal Conduction Module (Tcm) with Mounting Plate Carrying Pistons for Applying Force to . . . " IBM Tech Disc. Bull. p. 2876, Dec. 1986.

"Thermal Conduction Module with Integrated Cold Plate and Individual Cylinders for Pistons" IBM Tech Disc. Bull. pp. 5148-5149, Apr. 1987.

"Thermal Conduction Module with Helical Pistons" IBM Tech Disc. Bull. pp. 347-348, Jun. 1987.

"Thermal Conduction Module with Improved Piston for Thermal Transfer Between Chip & Hat . . . " IBM Tech Disc. Bull. Mar. 1988.

"Thermal Conduction Module (TCM) with Multi-Part Piston Having a Central Piston or Multiple . . . " IBM Tech Disc. Bull. May 1989.

"Thermal Conduction Module (TCM) Having Hollow Pistons with Internal Fins and Containing . . . " IBM Tech Disc. Bull. May 1989.

"Thermal Conduction Module (TCM) with Water Circulated Through Pistons" IBM Tech Disc. Bull. Aug. 1989.

"Thermal Conduction Module with Integral Cold Plate Formed by a Cover Plate and a Seal" IBM Tech Disc. Bull. pp. 447-448, Aug. 1989.

"Thermal Condcution Module with Pistons Having Channels for Carrying a Cooling Liquid . . . " IBM Tech Disc. Bull. p. 6898, May 1985.

"Thermal Conduction Module with Liquid Dielectric and Pistons with Surface Treatment . . . " IBM Tech Disc. Bull. p. 6904, May 1985.

\* cited by examiner

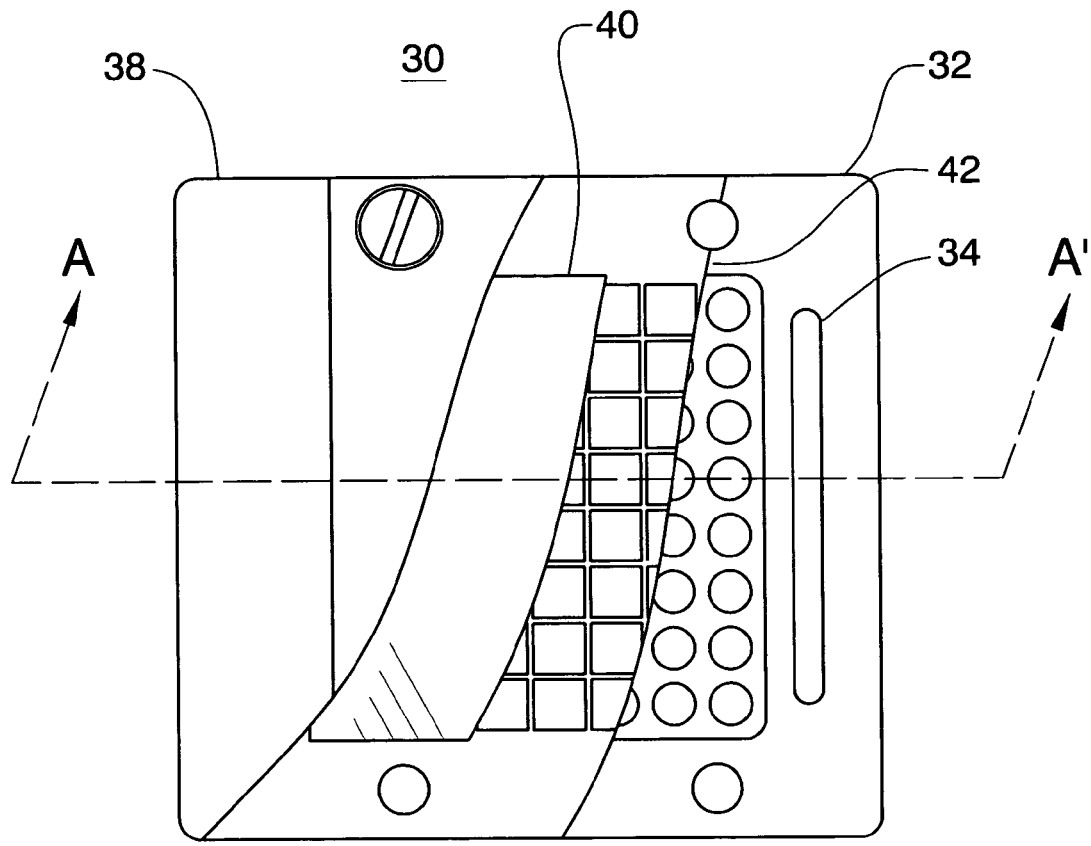
Fig. 2A
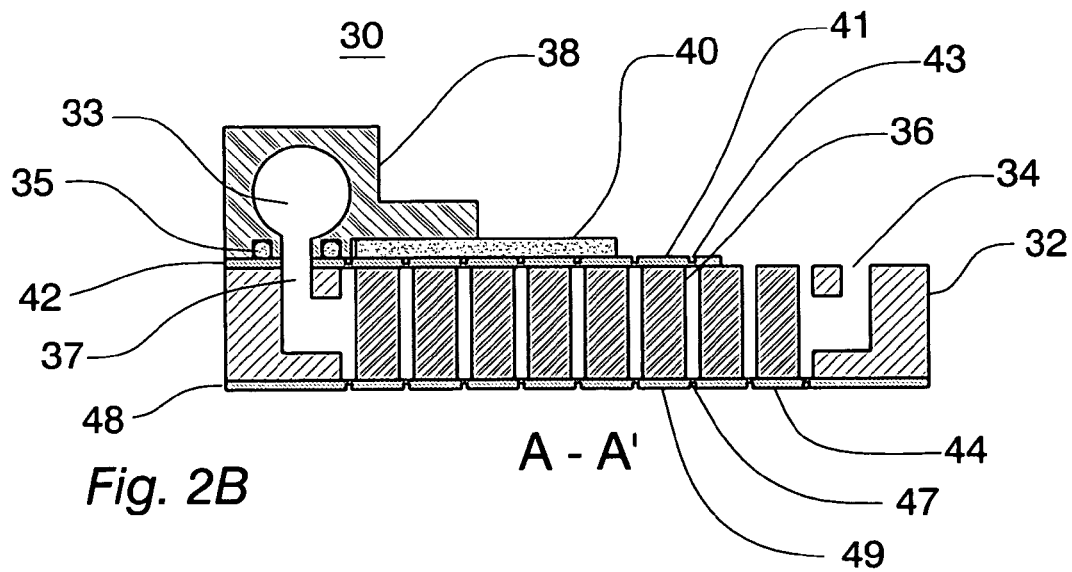
Fig. 2B   A - A'

COOLING APPARATUS FOR MICROELECTRONIC DEVICES

TECHNICAL FIELD OF THE INVENTION

One or more embodiments of the present invention relate to cooling apparatus for microelectronic devices.

BACKGROUND OF THE INVENTION

As technology advances, the performance of microelectronic devices such as semiconductor integrated circuits (also referred to herein as semiconductor chips or chips) increases. Such increased performance, as measured, for example, by clock speed and complexity of chips, has resulted in higher power dissipation of these chips. In addition, device dimensions have reached a point where leakage currents make a significant additional contribution to power dissipation of chips. As a result of these issues, cooling has become an important factor that limits progress in semiconductor electronics.

At present, chip power is limited to approximately 200 watts by an ability to cool the chip and to maintain chip junction temperatures at an average of about 85° C. This chip power limit of 200 watts is projected by the International Technology Roadmap for Semiconductors to remain static. At present maximum chip sizes of approximately 300 mm$^2$, the 200 watt limit corresponds to a thermal flux of approximately 60-70 watts/cm$^2$. In addition, recent semiconductor chip designs show further limitations due to hot spots that occur at local regions of the chip, depending upon the circuits being activated.

A standard practice for cooling a high power chip is to attach the chip to a thermally conductive plate (sometimes to referred to as a heat spreader) using a thermally conductive die attach adhesive, and to attach the heat spreader to a heat sink using a thermally conductive paste or a thermal elastomeric pad. The heat spreader spreads heat generated by the chip to an area larger than that of the chip, and the thermal flux output from the heat spreader to the heat sink is considerably less than that output from the chip to the heat spreader by reason of its having been spread over a larger area (i.e., the larger area of the heat spreader proportionately reduces the thermal flux). Thermal flux output from the heat spreader to the heat sink is conducted relatively efficiently through the thermal paste or thermal pad. Conventional heat sinks typically include convection cooled fin structures, fan cooled fin structures, and liquid-cooled platens. However, at higher levels of chip power, the above-described standard practice has limitations.

One such limitation with the standard practice is a problem in finding a material for the heat spreader that has a high thermal conductivity and a low coefficient of thermal expansion (CTE). A high thermal conductivity material is needed to spread the thermal flux over a large area to match the area of the heat sink, and a low CTE material is needed so the heat spreader does not induce stress or damage to a chip mounted thereon. For example, copper has a high thermal conductivity of 3.97 watts/cm$^2$-° C. and a high CTE of 17.7×10$^{-6}$/° C. The large mismatch between the CTE of silicon, i.e., 2.8×10$^{-6}$/° C., and the CTE of copper, i.e., 17.7×10$^{-6}$/° C., would cause warping and damage to a large chip if it were mounted directly on a copper heat spreader.

Since no inexpensive heat spreader material exists having high thermal conductivity and low CTE, the industry commonly uses a practical compromise in which a material of moderate thermal conductivity and CTE is used for the heat spreader. For example, a copper-tungsten composite material, CMC111 (available from Tokyo Tungsten Co. Ltd.), that is commonly used for the heat spreader exhibits a thermal conductivity of about 2.6 watts/cm$^2$-° C. and a CTE of about 9.2×10$^{-6}$/° C. In addition to a reduced CTE heat spreader, large chips such as microprocessors require a compliant die attach material be used to attach the chip to the heat spreader to further reduce thermal stress induced on the chip by temperature changes. Compliant die attach materials such as particle filled silicone films, thermally conductive pastes, and phase change materials cannot provide the high thermal conductivity of a direct rigid connection. This practical compromise provides limited thermal performance because of the reduced thermal conductivity of the heat spreader and because of the relatively high thermal resistance of compliant die attach materials. The thermal efficiency thus provided is no longer adequate for cooling high performance chips.

The electronics industry has made advances in chip cooling technology to meet demands for more efficient cooling. Many of these advances have been applied to mainframe computer technology, but most remain too costly for general use. One of the more successful approaches is an IBM thermally cooled module (TCM) that uses spring-loaded pistons pressing on chips sealed in a helium filled module. The TCM solves a problem of thermal expansion mismatch by using a piston that slideably contacts the chip surface. Although the TCM is too expensive for general use, its thermal performance is still insufficient for future cooling requirements.

Another approach to improve thermal performance is to use a solid diamond slab as a thermal spreader. The material has a thermal conductivity of about 20 watts/cm$^2$-° C. and a low CTE of about 2.3×10$^{-6}$/° C. that more closely matches the CTE of silicon. However, the cost of diamond has so far proven prohibitive.

Still another approach to improve thermal performance is to immerse a chip directly in a flow of liquid coolant or refrigerant. Microgrooves on the chip surface provide more efficient thermal transfer of heat from the chip to the liquid. Approaches of this nature are limited by boiling of the liquid, which boiling produces a gas pocket on the chip surface that inhibits efficient thermal transfer. Typical solutions to the problem of boiling entail controlling nucleation of boiling at points on the chip surface. While controlling nucleation of boiling improves thermal transfer, the resulting thermal performance is inadequate to cool high performance chips in the future.

Still another approach to improve thermal performance uses micro-channels etched directly in a chip to provide a larger area for thermal transfer between a cooling liquid and the chip. A spray of liquid coolant on the back of the chip is used in an attempt to reduce the effects of boiling in limiting performance. The cost and technical problems associated with sealing the chip to prevent liquid from leaking onto electronic equipment have limited widespread use of liquid immersion solutions in cooling semiconductor chips. For example, membranes and chip enclosures have been proposed as solutions to the problem of leakage of liquids. Because a thermally conductive membrane typically has a high CTE, the membrane is typically attached to the chip using a compliant or a sliding contact. As in the case of the heat spreader, the compliant attachment material has a relatively high thermal resistance that limits thermal performance of the membrane as a solution to containing liquids used to cool the chip.

In light of the above, there is a need in the art for method and apparatus useful for cooling high performance chips that solve one or more of the above-identified problems to enable the semiconductor industry to progress to smaller and faster chip designs.

SUMMARY OF THE INVENTION

One or more embodiments of the present invention solve one or more of the above-identified problems. In particular, one embodiment of the present invention is an apparatus for cooling a microelectronic device comprising: (a) a rigid support ring having a top surface and a bottom surface; (b) a mechanically resilient, thermally conductive bottom membrane having a top and a bottom surface, wherein the top surface of the membrane is attached to the bottom surface of the ring; and (c) a multiplicity of thermally conductive posts having top and bottom surfaces, the posts being disposed with their bottom surfaces in thermal contact with the top surface of the bottom membrane over an area, wherein the posts are arrayed in the area with spaces therebetween so that heat transferred from the microelectronic device to the bottom surface of the membrane may be transferred to the multiplicity of thermally conductive posts.

BRIEF DESCRIPTION OF THE DRAWING

FIG. 2A is a cutaway view of a top of an apparatus adapted for testing microelectronic devices in accordance with one or more embodiments of the present invention;

FIG. 2B is a partial cross sectional view of the apparatus of FIG. 2A as cut along plane A-A';

FIGS. 3B and 3C are cross sectional views of a portion of the apparatus shown in FIG. 3A which show details of a segmented membrane, wherein FIG. 3B shows the membrane before thermal expansion of segments thereof, and FIG. 3C shows the membrane after thermal expansion of the segments;

DETAILED DESCRIPTION

Figure 1A:
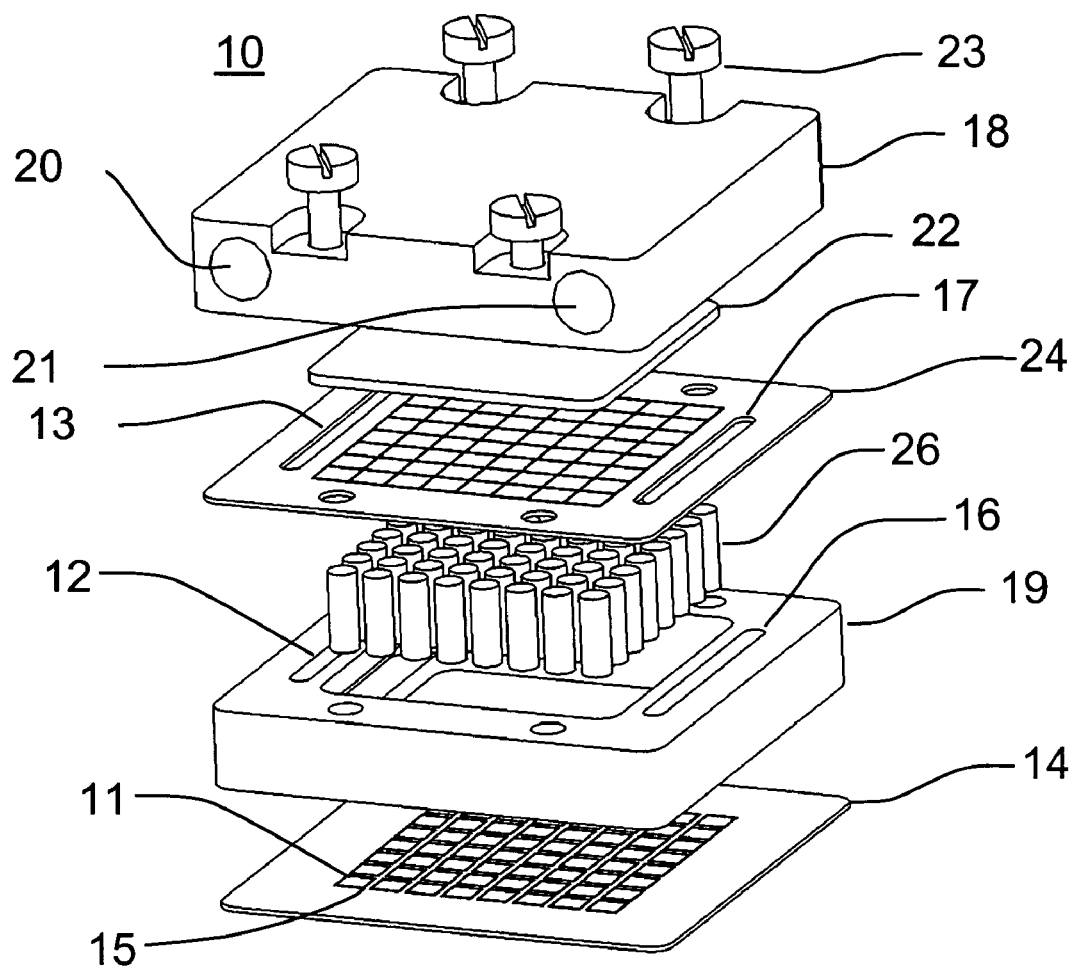
FIG. 1A is an exploded assembly view and FIG. 1B is a partial cross sectional view showing internal construction details, respectively, of an apparatus for cooling microelectronic devices that is fabricated in accordance with one or more embodiments of the present invention.

FIG. 1A is an exploded assembly view of apparatus 10 for cooling microelectronic devices such as semiconductor integrated circuits (also referred to herein as chips or semiconductor chips) that is fabricated in accordance with one or more embodiments of the present invention. As shown in FIG. 1A, support ring 19 is a rigid retaining ring that supports top membrane 24 and bottom membrane 14. It should be understood that the term support ring is not meant to limit embodiments of the present invention to configurations where a support ring refers to a structure having a generally circular shape. In fact, it is within the scope of the present invention that embodiments exist wherein support ring 19 refers to any support structure having a peripheral support portion with an empty area within the peripheral portion where the peripheral support structure may, for example and without limitation, be rectangular. In accordance with one or more embodiments of the present invention, support ring 19 is made of a copper-tellurium alloy, and, in accordance with other embodiments, support ring 19 may be made of copper, brass, kovar, invar, aluminum nitride ceramic, glass ceramic, aluminum oxide or any rigid material. In accordance with one or more embodiments of the present invention, the material used to fabricate support ring 19 (i.e., the ring material) is selected, apart from its ability to provide rigid support, for its coefficient of thermal expansion (CTE). For example, in an application of apparatus 10 as a heat sink to cool a semiconductor integrated circuit by, for example and without limitation, attachment of apparatus 10 directly to the chip, the ring material is preferably selected to have a low CTE. For example, a ring material of invar, kovar, or aluminum nitride is preferable for applications wherein apparatus 10 is used as a heat sink to cool a silicon chip that is attached directly thereto. In accordance with one or more embodiments of the present invention, rigid support ring 19 is preferably between 1.0 mm and 15.0 mm thick, for example and without limitation, rigid support ring 19 may be 5.0 mm thick.

As further shown in FIG. 1, mechanically resilient membranes 14 and 24 are attached to bottom and top surfaces of support ring 10, respectively utilizing any one of a number of methods that are well known to those of ordinary skill in the art, for example and without limitation, by diffusion bonding. In accordance with one or more embodiments of the present invention, the material used to fabricate membranes 14 and 24 (i.e., the membrane material) is selected for its thermal conductivity (a high thermal conductivity being preferred) and for its mechanical tensile strength and elongation. For example, in an application of apparatus 10 as a heat sink to cool a semiconductor integrated circuit by attachment of apparatus 10 directly to the chip, the membrane material may be a beryllium-copper spring alloy ASTM B534 or it may be selected from a group including sterling silver, coin silver, phosphor bronze, nitionol, Ni—Ti alloys, and various copper alloys such as alloy 186 (available from Olin Brass Company of Bridgeport, Conn.), and copper alloy ASTM B422.

As further shown in FIG. 1A, in accordance with one or more embodiments of the present invention, membrane 14 comprises segments 11 of thermally conductive material separated by matrix 15 made of a mechanically resilient material. In accordance with one or more embodiments of the present invention, the mechanically resilient material of matrix 15 is preferably thin, for example and without limitation, having a thickness between 25 and 100 micrometers. Segments 11 may be thicker than the mechanically resilient material of matrix 15. In accordance with one or more embodiments of the present invention, segments 11 may be formed from several layers of material. For example, in accordance with one embodiment, segments 11 include 50 micrometers of silver, 50 micrometers of a beryllium-copper alloy ASTM B534, and 50 micrometers of silver. In accordance with one or more embodiments of the present invention, membrane 24 is fabricated like membrane 14, and as such, is comprised of segments of material separated by a matrix made of mechanically resilient material. In particular, and in accordance with one or more such embodiments, the mechanically resilient material of the matrix of membrane 24 may be the same as the mechanically resilient material of matrix 15. In further particular, and in accordance with one or more such embodiments, the material of segments of membrane 24 may be the same as the material of segments 11 of membrane 14.

As further shown in FIG. 1A, in accordance with one or more embodiments of the present invention, an array of thermally conductive posts 26 are positioned between membranes 14 and 24. In accordance with one or more embodiments of the present invention, posts 26 are round or square in cross section. Of course, those of ordinary skill in the art should understand that further embodiments exist (as will be described below) in which posts 26 may have other shapes, for example and without limitation, more complex shapes, that also provide, or even improve, thermal contact with a cooling fluid. In accordance with one or more embodiments of the present invention, posts 26 are in thermal contact with membranes 14 and 24. In particular, and in accordance with one or more such embodiments of the present invention, each of posts 26 is in thermal contact with (for example and without limitation by being attached to) one of thermally conductive segments 11 of membrane 14 to conduct heat from the segment through the post to cooling fluid circulating around the post. In further particular, and in accordance with one or more such embodiments of the present invention, posts 26 are disposed with spaces therebetween to enable passage of a cooling fluid. For example, in accordance with one embodiment, posts 26 are copper alloy ASTM B152 cylinders that are area diffusion bonded directly to top membrane 24 and to bottom membrane 14 to form a thermal contact therebetween. Further, in accordance with another embodiment, posts 26 are slideably attached to membrane 14 to form a thermal contact therebetween.

As further shown in FIG. 1A, apparatus 10 includes resilient pad 22 that is positioned between manifold 18 and top membrane 24. In accordance with one or more embodiments of the present invention, resilient pad 22 is an elastomeric pad. Any one of a number of elastomers suitable for use in fabricating embodiments of the present invention are well known to those of ordinary skill in the art. In addition, in accordance with one embodiment of the present invention, manifold 30 is made of plastic, but as one of ordinary skill in the art will readily appreciate, it may be made of any one of a number of suitable materials that are well known to those of ordinary skill in the art.

In use, when apparatus 10 is assembled, for example and without limitation, by tightening screws 23 to bring manifold 18 close to support ring 19, resilient pad 22 transmits force downward from manifold 18 onto membrane 24. Then, in accordance with one or more embodiments of the present invention, membrane 24 transmits the force applied thereto, through the array of posts 26, to individual ones of thermally conductive segments 11 of bottom membrane 14. In accordance with one or more embodiments of the present invention, because thermally conductive segments 11 are held by mechanically resilient matrix 15, they can move vertically to transmit force upwardly through posts thermally contacted (for example, by being attached) thereto and onto top membrane 24. Then, the mechanically resilient matrix of membrane 24 enables upward flexure of top member 24, which upward flexure is accommodated by resilient pad 22. This capability of segments 11 to move provides bottom membrane 14 with compliance to enable it to conform to any device to which it is urged into contact.

Figure 1B:
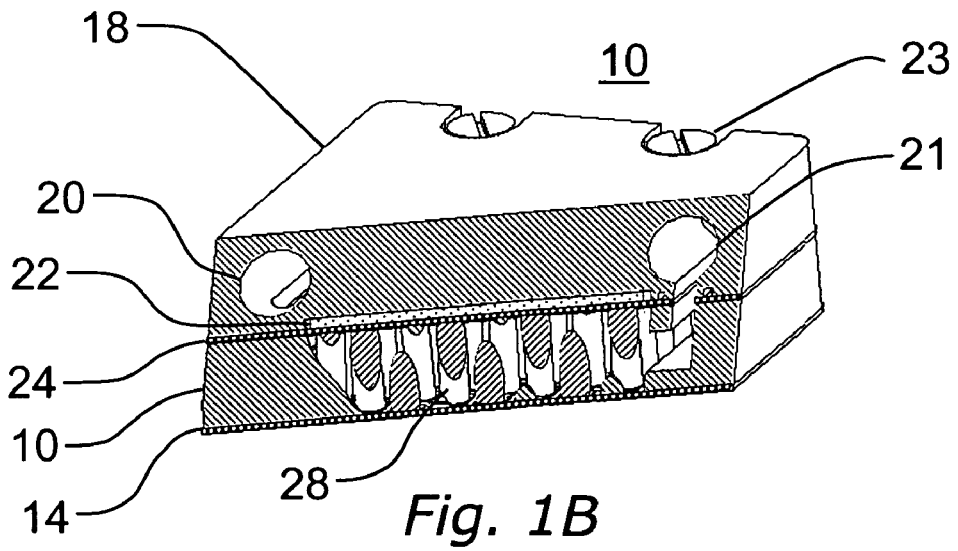

FIG. 1B is a partial cross sectional view showing internal construction details of apparatus 10. When apparatus 10 is assembled, top membrane 24 and bottom membrane 14 are joined to support ring 19 to form a cavity for cooling fluid that may be contained therebetween. In assembled apparatus 10, each of thermally conductive posts 26, such as post 28 shown in FIG. 1B, is thermally contacted at a top end to top membrane 24 and is thermally contacted at a bottom end to bottom membrane 14. As explained above, resilient pad 22 held between manifold 18 and top membrane 24 accommodates upward flexure of top membrane 24.

In use, cooling fluid is input, for example and without limitation, under pressure, into manifold 18 through inlet port 20 (one of ordinary skill in the art may determine an appropriate pressure routinely and without undue experimentation, for example and without limitation, in accordance with one or more embodiments a suitable pressure may be in a range from about 60 to about 80 psi). Referring to FIG. 1A, the cooling fluid is directed downward through aperture 13 in top membrane 24, and then through aperture 12 into a passageway in support ring 19. The cooling fluid then flows through the array of posts 26 (i.e., past each of posts 26) to transfer heat by conduction from each post 26 to the cooling fluid. The cooling fluid exits the cavity by passing out through another passageway to aperture 16 in support ring 19, through aperture 17 in top membrane 24, and into manifold 18. Then, the cooling fluid exits through outlet port 21 in manifold 18. Accordingly, heat removed from thermally conductive segments 11 is carried away by the circulating cooling fluid. Cooling fluids may be gases or liquids. For example, and without limitation, cooling fluids well known in the art include air, helium, water, water-glycol mixtures, Galden LS/155 (available from Solvay Solexis, Inc.), Fluorinert FC-77 (available from 3M Corporation), and others.

As one of ordinary skill in the art can readily appreciate from the above, one or more embodiments of the present invention provide method and apparatus for cooling microelectronic devices such as, for example and without limitation, a high power microelectronic device. More particularly, one or more embodiments of the present invention provide method and apparatus for cooling such a high power microelectronic device using a mechanically compliant heat sink that enables a rigid connection between a device and a heat sink attached thereto without generating thermally induced stresses in the connection. One of such embodiments of the present invention are adapted for use in cooling a microelectronic device such as, for example and without limitation, a semiconductor chip, a packaged semiconductor chip, a multi-chip module, and a high power microelectronic device. In use, in accordance with one or more such embodiments for cooling a microelectronic device, the microelectronic device may be attached directly to membrane 14 on a side of membrane 14 (opposite the side on which the array of posts 26 are attached) using any one of a number of high conductivity die attach materials well known to those of ordinary skill in the art. As was described above, the array of posts 26 forms a heat sink for absorption of heat from the microelectronic device and transmits the heat to the cooling fluid. In accordance with one or more embodiments of the present invention, each of segments 11 of membrane 14 may be rigidly attached to the microelectronic device by the die attach material. During a change of temperature, each of segments 11 of membrane 14 substantially follows thermal expansion of the microelectronic device rather than expansion of membrane 14 so that differential expansion of the microelectronic device relative to that of membrane 14 is taken up by flexure of mechanically resilient regions 15 between each segment 11. In accordance with one or more embodiments of the present invention, each of segments 11 is made sufficiently small such that thermally induced stresses under such segment does not cause mechanical failure. In particular, the size of each of segments 11 is small in comparison to the size of the microelectronic device to be cooled, so that a multitude of segments are needed to contact the microelectronic device. An appropriate size for segments 11 and an appropriate amount of resiliency for matrix 15 can be determined by one of ordinary skill in the art routinely and without undue experimentation.

As described above, in accordance with one or more embodiments of the present invention, a heat sink is provided (i.e., apparatus 10) that has a low overall thermal expansion coefficient (CTE) such that it may be rigidly attached to a microelectronic device such as a semiconductor chip without inducing damaging thermal stresses between the heat sink and the chip. Membrane 14 comprising an array of thermally conductive segments 11 is held in tension by attachment to rigid support ring 19 which, in a preferred embodiment, may be made of low CTE material. As further described above, each of thermally conductive segments 11 in an array of thermally conductive segments is connected to segments directly adjacent to it by means of mechanically resilient connection or coupling elements that enable expansion of spacing between a segment and its adjacent segments. As will described in detail below, one such matrix of mechanically resilient connection or coupling elements is provided by etching parallel grooves in top and bottom surfaces of membrane 14, wherein grooves in the top surface are offset with respect to grooves in the bottom surface to form an undulating pattern in a cross section of membrane 14. As described above, thermally conductive posts 16 may be attached to a top side of membrane 14 so that one or more of posts 26 is attached to each of segments of membrane 14. Posts 26 provide a thermal path from membrane 14, through posts 26 and into a cooling fluid that flows around posts 26. In accordance with one or more embodiments of the present invention, membrane 14 (comprising an array of thermally conductive segments 11 with a matrix 15 of mechanically resilient connection or coupling elements disposed therebetween) is held under tension by support ring 19. In accordance with one or embodiments of the present invention, membranes 14 and 24 may be attached to support ring 19 under tension by heating these components, and by diffusion bonding the membranes to the support ring. Then, as the assembly cools, a desired tension is provided (a desired tension can be determined by one of ordinary skill in the art for any particular embodiment routinely and without undue experimentation). In operation, each of thermally conductive segments 11 expands laterally as the temperature of membrane 14 increases. In accordance with one or more embodiments, the CTE of each of thermally conductive segments 11 is greater than the CTE of support ring 19. However, in accordance with one or more embodiments of the present invention, expansion of segments 11 compresses the mechanically resilient connections between segments 11 to render the overall expansion of membrane 14 substantially equal to the expansion of support ring 19 to which it is attached. Thus, in accordance with one or more embodiments of the present invention, a rate of expansion of the array of thermally conductive segments 11, as measured at a center point of each segment 11, is nearly matched to a low rate of expansion of support ring 19.

FIG. 2A is a cutaway view of a top of apparatus 30 adapted for testing microelectronic devices in accordance with one or more embodiments of the present invention. FIG. 2B is a partial cross sectional view of apparatus 30 as cut along plane A-A' of FIG. 2A. As shown in FIG. 2A, rigid support ring 32 holds top membrane 42 in tension and bottom membrane 48 in tension. In accordance with one or more embodiments of the present invention, rigid support ring 32 is made of invar, a low thermal expansion alloy of nickel-iron having a CTE of approximately $1.7 \times 10^{-6}/°$ C. Top membrane 42 and bottom membrane 48 are made of beryllium-copper alloy ASTM B534 having a relatively high CTE of approximately $17.7 \times 10^{-6}/°$ C. Top membrane 42 and bottom membrane 48 are held in tension by rigid support ring 32, which tension constrains thermal expansion of each membrane to follow the lower expansion rate of low CTE rigid support ring 32.

As shown in FIG. 2B, each of thermally conductive posts (also referred to herein as columns) 36 is joined on its top surface to one of thermally conductive area segments 41 of top membrane 42. In accordance with one or more embodiments of the present invention, each of thermally conductive area segments 41 of top membrane 42 is surrounded by mechanically resilient matrix 43 formed in top membrane 42. Likewise, each of thermally conductive posts 36 is joined on its bottom surface to one of thermally conductive area segments 49 of bottom membrane 48. In accordance with one or more embodiments of the present invention, each of thermally conductive area segments 49 of bottom membrane 48 is surrounded by mechanically resilient matrix 47 formed in bottom membrane 48. In accordance with one embodiment of the present invention, posts 36 are cylinders made of coin silver having a circular cross section and a length of 5.0 mm.

As further shown in FIG. 2B, apparatus 30 includes resilient pad 40 which is disposed on a top surface of top membrane 42 and is held under a cavity in manifold 38. In accordance with one or more embodiments of the present invention, resilient pad 40 allows segments 41 of top membrane 42 to move compliantly in response to movement of posts 36. In accordance with one or more embodiments of the present invention, resilient pad 40 is an elastomeric pad made of silicone DC 577 (available from Dow Corning Corporation). Any one of a number of elastomers suitable for use in fabricating embodiments of the present invention are well known to those of ordinary skill in the art. For illustrative purposes to aid in understanding how apparatus 30 operates, assume that a protuberance on a surface of the microelectronic device presses upward against segment 49 of bottom membrane 48. In response, segment 49 would be moved upward. The upward movement of segment 49 would cause post 36, and in turn, segment 41 of upper membrane 42, to move upward. As one can readily appreciate from this, in accordance with one or more embodiments of the present invention, resilient matrices 43 and 47 of top and bottom membranes 42 and 48, respectively, in combination with resilient pad 40 disposed against top membrane 42, provide a mechanically compliant surface at membrane 48 that facilitates testing of microelectronic devices with imperfect or warped surfaces.

As may be understood by referring to FIGS. 2A and 2B, apparatus 30 is cooled by circulating a cooling fluid therethrough. In particular, the cooling fluid is input, for example and without limitation, under pressure, to intake port 33 in manifold 38 which is sealed to top membrane 42 by "O" ring seal 35. In accordance with one embodiment of the present invention, manifold 30 is made of plastic, but as one of ordinary skill in the art will readily appreciate, it may be made of any one of a number of suitable materials that are well known to those of ordinary skill in the art. The cooling fluid is directed downward through an aperture (not shown) in top membrane 42, and then through aperture 37 in support ring 32 to a passageway therein. The cooling fluid then flows through the array of posts 36 (i.e., past each of posts 36) disposed in a cavity of support ring 32, to transfer heat by conduction from each post 36 to the cool fluid. Then, the cooling fluid exits the cavity by passing out through another passageway to aperture 34 in support ring 32, through aperture 34 in top membrane 42, and into manifold 30. Next, the cooling fluid exits from an outlet port (not shown) in manifold 30. Although the cutaway view does not show all of top membrane 42, top membrane 42 seals apparatus 30 to prevent leakage of cooling fluid.

As one of ordinary skill in the art can readily appreciate from the above, one or more embodiments of the present invention provide method and apparatus for testing microelectronic devices such as, for example and without limitation, a high power microelectronic device. More particularly, one or more such embodiments of the present invention provide method and apparatus for testing such a high power microelectronic device using a mechanically compliant heat sink. In accordance with one or more such embodiments, during testing, the mechanically compliant heat sink is detachably mounted to the microelectronic device by applying pressure to urge the heat sink, for example, downward, onto a top surface of the microelectronic device. As a result, and in accordance with one or more such embodiments, a mechanically compliant membrane (forming a bottom surface of the heat sink) makes contact with the top surface of the microelectronic device. In accordance with one or more such embodiments, the membrane and associated cooling elements of the heat sink, as described above, are mechanically compliant and enable the bottom surface of the heat sink to deform in response to imperfections (such as particles, warping, bowing and surface contours) on the microelectronic device. As a result, the bottom surface of the heat sink is held in substantially intimate contact with an imperfect top surface of the microelectronic device. Advantageously, thermal conduction between the heat sink and the microelectronic device is increased by compliant deformation of the bottom surface of the heat sink, which compliant deformation minimizes spacing between each element of the surface of the microelectronic device and juxtaposed area elements of the bottom surface of the heat sink. After testing, the heat sink is detached from the device, and it may then be urged into contact with another device to be tested. Advantageously, in accordance with one or more such embodiments, the mechanically resilient membrane on the bottom of the heat sink compliantly deforms to accommodate imperfections on the next device to be tested. As one or ordinary skill in the art can readily appreciate, because the membrane is mechanically resilient, it can compliantly deform repeatedly for each device being tested without damage to the membrane or the head sink. Further, because the bottom surface of the heat sink deforms to fill the spaces between the heat sink and an imperfect surface of the device, it eliminates a need for an additional compliant gap filler material used in the prior art. As a result, one or more such embodiments provide high thermal conductivity connections to the device.

Figure 3A:
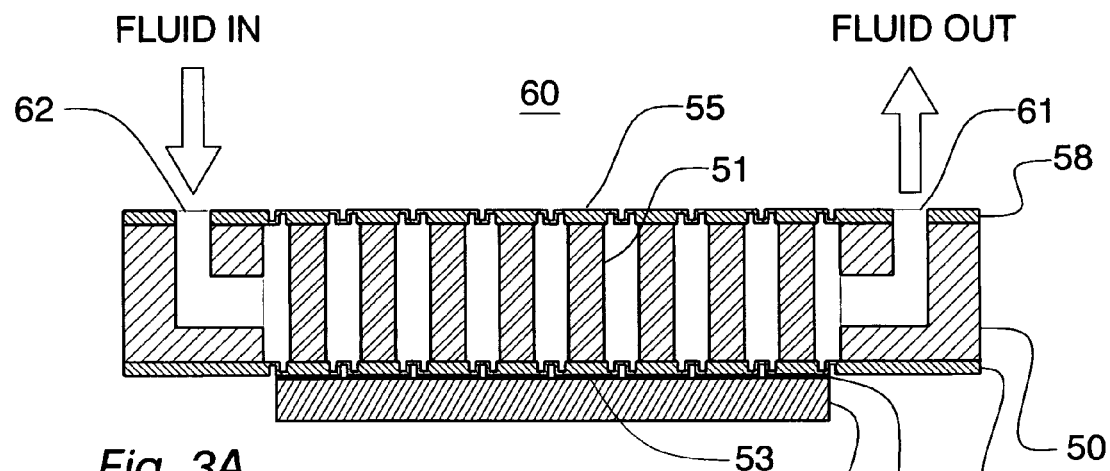
FIG. 3A is a cross sectional view of an apparatus that is fabricated in accordance with one or more embodiments of the present invention.

FIG. 3A is a cross sectional view of apparatus 60 that is fabricated in accordance with one or more embodiments of the present invention and that may be used to cool a microelectronic device such as, for example and without limitation, a semiconductor device. As shown in FIG. 3A, apparatus 60 is rigidly attached to semiconductor device 70. Apparatus 60 may be attached to apparatus 60 using any one of a number of methods that are well known to those of ordinary skill in the art and which provide a predetermined thermal conductivity between semiconductor device 70 and apparatus 60. In operation, in accordance with one or more embodiments of the present invention, cooling fluid, for example and without limitation, pressurized cooling fluid, flows into a cavity in support ring 50 in which an array of posts 51 are disposed through entry aperture 62 in top membrane 58, and out of the cavity through exit aperture 61 in top membrane 58. In transit through the cavity, cooling fluid flows around each one of posts 51. As shown in FIG. 3A, and as has been described above, top membrane 58 and bottom membrane 52 are held in tension by support ring 50 which is made of a rigid, low expansion material.

As further shown in FIG. 3A, post 51, together with thermally conductive segment 55 of top membrane 58 and thermally conductive segment 53 of bottom membrane 52 forms a thermally conductive element of an array of such structures. In accordance with one or more embodiments of the present invention, each element of the array is able to move resiliently and, as such, provides a measure of mechanical compliance to a segment, for example, segment 53, that thermally contacts semiconductor device 70 under test. In addition, in accordance with one or more embodiments of the present invention, each element of the array functions to help prevent bottom membrane 52 from bowing downward under pressure from the cooling fluid. This occurs in accordance with one or more embodiments of the present invention where posts in the array, for example, post 51, are tied to both top membrane 58 and bottom membrane 52, and because of this, the membranes are inhibited from being distorted by pressure in the cooling fluid while allowing compliant movement of segments, for example, segment 53, to which they are attached.

Figure 3B:
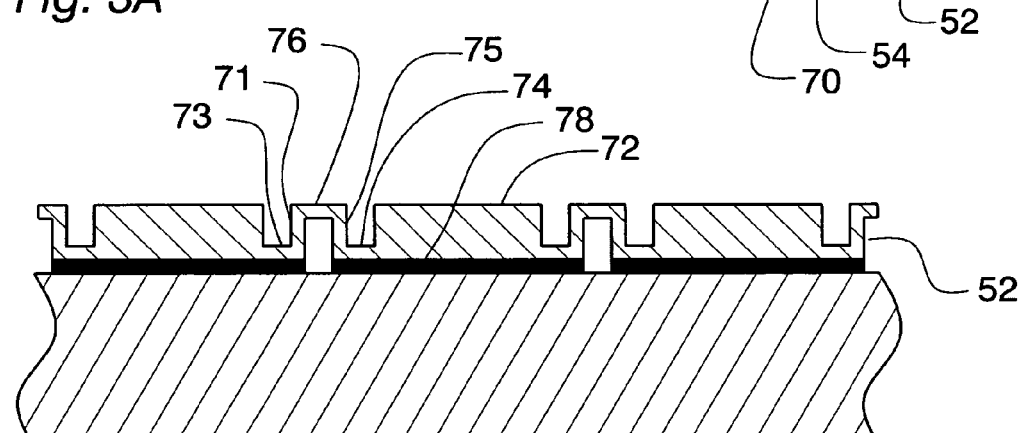

FIG. 3B is a cross sectional view of a portion of apparatus 60, including membrane 52, which shows mechanically resilient connections between thermally conductive segments 72 of membrane 52 at room temperature. In accordance with one or more embodiments of the present invention, the mechanically resilient connections are embodied as an undulating link between segment 72 and its adjacent segments. In accordance with one or more embodiments of the present invention, as shown in FIG. 3B, the undulating link comprises in sequence from right to left: thin lateral section 74, vertical section 75, lateral section 76, vertical section 71, and lateral section 73. As further shown in FIG. 3B, each thermally conductive segment 72 of bottom membrane 52 is attached to a top surface of semiconductor device 70 by means of layer 78 of die attach material. Because the lateral dimensions of segment 72 are relatively small compared to the area of the top surface of device 70, layer 78 of die attach material may be thin and relatively rigid without inducing a damaging level of thermal stress in device 70. In accordance with one or more embodiments of the present invention, each thermally conductive segment 72 is a square wherein a length of a side is in a range between about 0.3 mm and about 5.0 mm, for example and without limitation, in a range between about 1.0 and about 2.5 mm. In accordance with one or more embodiments of the present invention, the die attach material may be selected from any one of a number of materials that are well known to those of ordinary skill in the art such as, for example, a group of materials including gold-tin alloy, gold-germanium alloy, gold-silicon alloy, lead-tin solder, indium alloys, silver filled epoxy, and particle filled adhesive polymers.

Figure 3C:
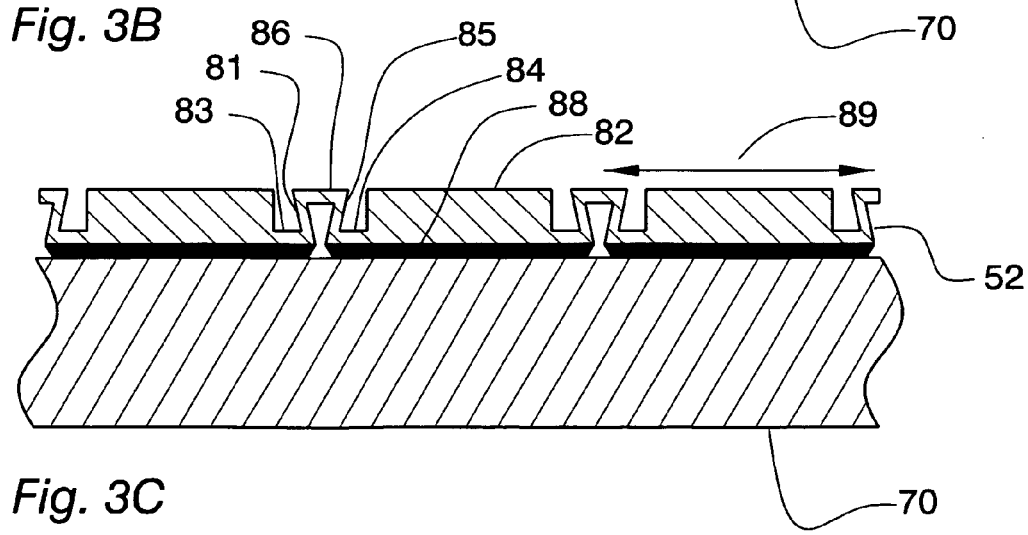

FIG. 3C is a cross sectional view of a portion of apparatus 60, including membrane 52, which shows mechanically resilient connections between thermally conductive segments 82 of membrane 52 at an elevated temperature above room temperature. In accordance with one or more embodiments of the present invention, the mechanically resilient connections are embodied as an undulating link between segment 82 and its adjacent segments. As above, and as shown in FIG. 3C, the undulating link comprises in sequence from right to left: thin lateral section 84, vertical section 85, lateral section 86, vertical section 81, and lateral section 83. As further shown in FIG. 3C, each thermally conductive segment 82 of bottom membrane 52 is attached to a top surface of semiconductor device 70 by means of a thin layer 88 of die attach material. In this case, the elevated operating temperature causes thermally conductive segment 82 to expand more than its juxtaposed portion of the top surface of semiconductor device 70. This differential expansion distorts a region around die attach material 88 and also distorts elements 81 and 85 of the mechanically resilient connection, i.e., the undulating link. In accordance with one or more embodiments of the present invention, because of a resilient connection between thermally conductive segments provided by, for example and without limitation, the undulating link, a center point of each of the thermally conductive segments, for example, segment 88, remains unmoved with respect to juxtaposed portions of the top surface of semiconductor device 70. Advantageously, and in accordance with such embodiments, the CTE of membrane 52, as measured at center points of its thermally conductive segments, is substantially the same as that of semiconductor device 70 to which it is attached. That is, firstly, each of segments 82 is able to move in response to thermal expansion of semiconductor device 70 without causing a damaging amount of stress in die attach material 88. Secondly, each of segments 82 is also able to undergo thermal expansion 89 without significantly moving the center of segment 82 with respect to device 70. As a result of these two thermally induced expansions, the center of each of segments 82 remains substantially fixed with respect to the adjacent portion of juxtaposed device 70.

Figure 4B:
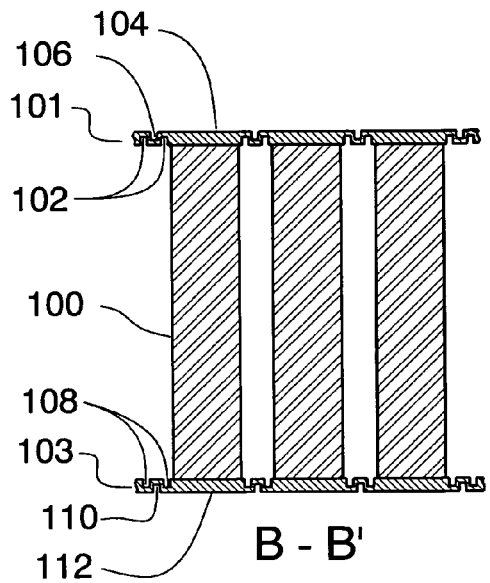
FIGS. 4B and 4C are cross sectional views of a portion of an apparatus that uses the membrane of FIG. 4A as cut along plane B-B'.
Figure 4D:
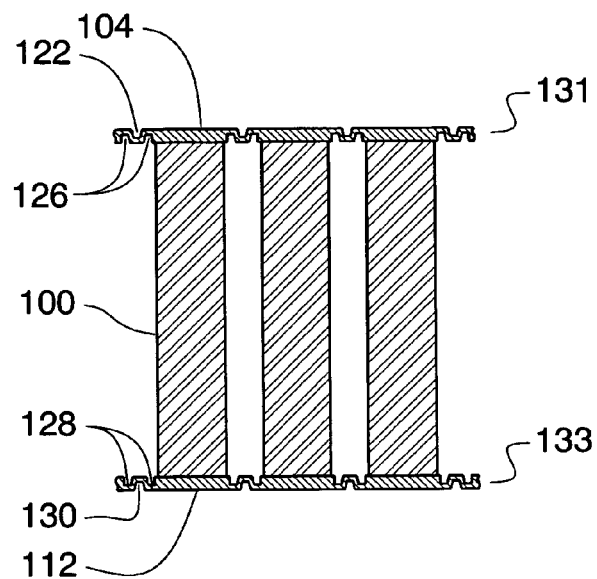
FIGS. 4D and 4E are cross sectional views of the portions shown in FIGS. 4B and 4C, respectively, after tension has been applied to the membrane.
Figure 4C:
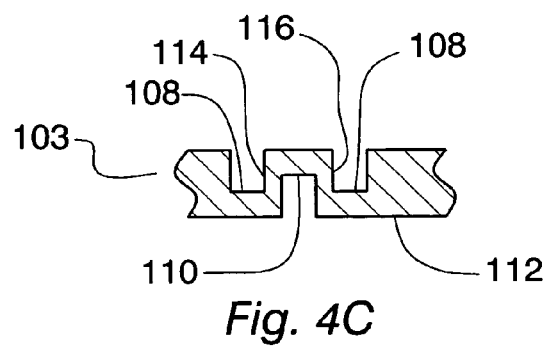
Figure 4A:
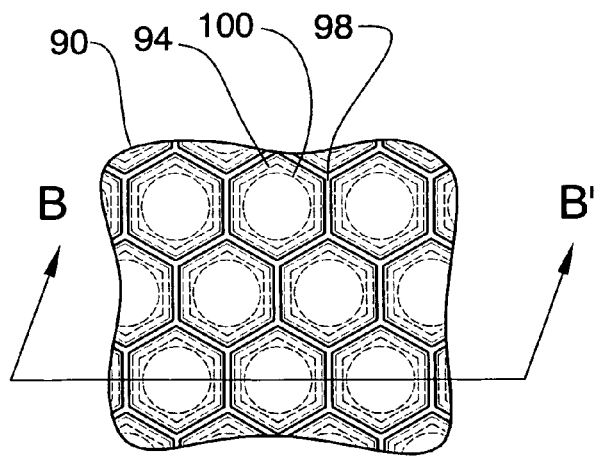
FIG. 4A is a top view of a portion of a membrane used to fabricate one or more embodiments of the present invention having hexagonal segments and mechanically resilient connections therebetween.

FIG. 4A is top view of a portion of membrane 90 used to fabricate one or more embodiments of the present invention in which membrane 90 is divided into thermally conductive segments, for example, like thermally conductive segment 94 that has a hexagonal shape, which segments are arranged in a hexagonal pattern. Further, as shown in FIG. 4A, each segment is connected to adjacent segments by mechanically resilient connection elements, for example, like resilient connection element 98. In addition, as will be described in more detail below, a cylindrical post, for example, like cylindrical post 100 shown in FIGS. 4B and 4D, is attached to each thermally conductive segment, for example, like thermally conductive segment 94.

FIG. 4B is a cross sectional view of a portion of an apparatus that is fabricated in accordance with one or more embodiments of the present invention and that uses membrane 90, the cross sectional view being along the cut plane B-B' of FIG. 4A. As shown in FIG. 4B, conductive posts, for example, conductive post 100, are attached at a top end to thermally conductive segments, for example, thermally conductive segment 104, in top membrane 101, and at a bottom end to thermally conductive segments, for example, thermally conductive segment 112, in bottom membrane 103. In addition, as further shown in FIG. 4B, conductive segment 104 is connected to adjacent segments in top membrane 101 by an undulating link formed by channel 106 in a top surface of top membrane 101 and two channels 102 in a bottom surface of top membrane 101, which two channels 102 are offset laterally from channel 106. Similarly, thermally conductive segment 112 is connected to adjacent segments in bottom membrane 103 by an undulating link formed by channel 110 in a bottom surface of membrane 103 and two channels 108 in a top surface of bottom membrane 103, which two channels 108 are offset laterally from channel 110.

FIG. 4C shows details of a resilient connection element which is disposed in bottom membrane 103 and shown in FIG. 4B. As shown in FIG. 4C, an undulating link which connects thermally conductive segment 112 to adjacent segments includes: (a) channel 110 in the bottom surface of bottom membrane 103; (b) laterally offset, relatively parallel channels 108 in the top surface of bottom membrane 103; and (c) relatively vertical elements 114 and 116. In accordance with one or more embodiments of the present invention, the degree of resilience of the undulating link may be increased by increasing the number of parallel channels in membrane 103, and may be decreased by reducing the number of parallel channels in membrane 103. In addition, in accordance with one or more embodiments of the present invention, the thermally conductive segments, for example, thermally conductive segment 112 may include a layer of silver on top and/or bottom surfaces, which layers may be applied by plating in accordance with any one of a number of methods well known to those of ordinary skill in the art. In accordance with one or more further embodiments of the present invention, such a layer, for example, a plated layer, may overlay in part channels 110 and 108 in membrane 103.

FIG. 4D is a cross sectional view showing the portion shown in FIG. 4B where top membrane 131 and bottom membrane 133 are held in tension. As was the case for the structure shown in FIG. 4B, thermally conductive segments are connected to adjacent segments in top membrane 131 and in bottom membrane 133 by undulating links. For example, as shown in FIG. 4D, (a) an undulating link in top membrane 131 is formed by channel 122 in a top surface of top membrane 131 and two channels 126 in a bottom surface of top membrane 131, which two channels 126 are offset laterally from channel 122; and (b) an undulating link in bottom membrane 133 is formed by channel 112 in bottom surface of bottom membrane 133 and two channels 108 in a top surface of bottom membrane 133, which two channels 128 are offset laterally from channel 112. Each of the undulating links between each of segments 112 is stretched so as to hold membrane 133 in tension laterally. If the ends of membrane 133 are held fixed in a stationary position, an expansion of each of segments 112 due to an increase in temperature acts to relax tension in the stretched undulating links therebetween while maintaining centers of segments 112 fixed relative to the stationary position of the ends of membrane 133.

Figure 4E:
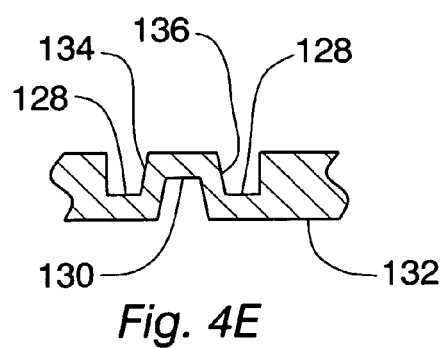

FIG. 4E is a cross sectional view showing the portion shown in FIG. 4C where top membrane 131 and bottom membrane 133 are held in tension. As was the case for the structure shown in FIG. 4C, an undulating link which connects thermally conductive segment 112 to adjacent segments includes: (a) channel 130 in the bottom surface of bottom membrane 133; (b) laterally offset, relatively parallel channels 128 on the top surface of bottom membrane 133; and (c) relatively vertical elements 134 and 136. As shown in FIG. 4E, elements 134 and 136 are distorted by tension in membrane 133. Further, in accordance with one or more embodiments of the present invention, resilience of the undulating link is due, at least in part, by the resilience to distortion of portions such as elements 134 and 136.

Figures 5A, 5B, 5C:
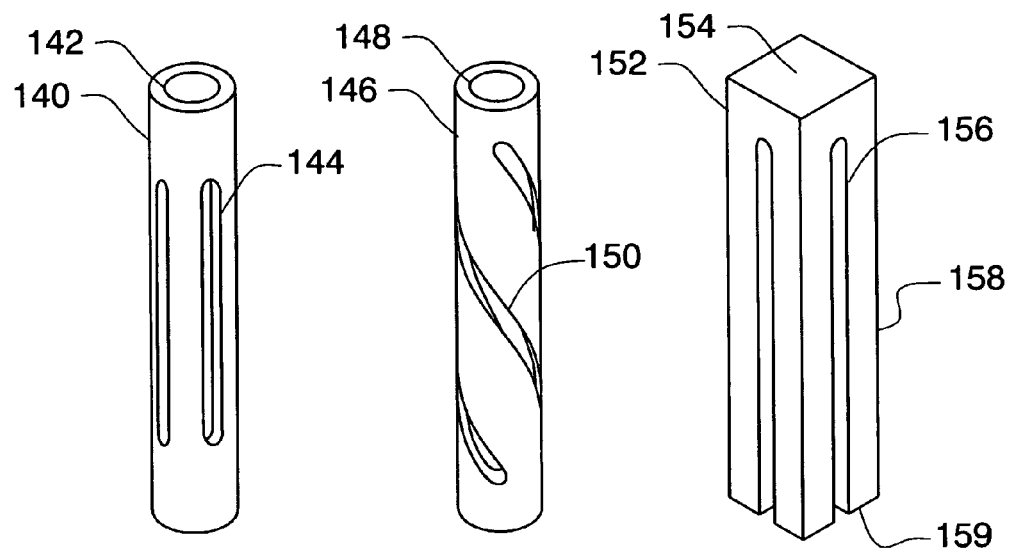
FIGS. 5A, 5B and 5C show thermally conductive posts that are fabricated in accordance with one or more embodiments of the present invention.

FIGS. 5A, 5B and 5C show thermally conductive posts that are fabricated in accordance with one or more embodiments of the present invention that enhance thermal transfer to a cooling fluid. As shown in FIG. 5A, thermally conductive post 140 comprises tube 142 having a hollow core and slots 144 disposed in a side wall of the tube. In accordance with one or more embodiments of the present invention, slots 144 allow cooling fluid to circulate into the tube, increasing surface area in contact with the cooling fluid and thereby increasing transfer of heat from post 140 to the cooling fluid. An appropriate number, size, and positioning of slots may be determined by one of ordinary skill in the art routinely and without undue experimentation.

As shown in FIG. 5B, thermally conductive post 146 comprises post 148 having grooves 150 disposed in a side wall of the post wherein slots 150 are spiral grooves. The grooves 150 increase heat transfer from post 146 to a surrounding cooling fluid by increasing surface area of the post that is in contact with the fluid and by acting to mix the fluid flowing past the post.

Post 146 of FIG. 5B may have an interior hole 148 to form a hollow tube. The spiral grooves 150 may be cut through tube 146 to form helical springs in the wall of the tube. As such, the helical springs of thermally conductive post 146 provide spring action so that post 146 provides a vertical resilience that enhances the resilience of any membrane attached thereto. Further, the hollow tube allows electrical leads from a temperature sensor to be routed through a portion of the tube length, to allow positioning a thermal sensor such as a thermocouple directly on the membrane in order to obtain accurate temperature measurements.

As shown in FIG. 5C, thermally conductive post 152 comprises multiple legs 158 that are attached to flat portion 154. In accordance with one or more such embodiments, flat portion 154 increases heat flow from legs 158 to any membrane attached to flat portion 154. In addition, slots 156 disposed between legs 158 allow cooling fluid to contact a larger surface area of post 152, and thereby enable increased heat flow from post 152 to the cooling fluid.

The embodiments shown in FIGS. 5A, 5B and 5C may be fabricated of any one of a number of thermally conductive materials that are well known to those of ordinary skill in the art using any one of a number of fabrication methods that are well known in the art. In addition, in accordance with one or more embodiments of the present invention, posts may be coated with a high thermal conductivity material such as, for example and without limitation, diamond, which may be deposited by any one of a number of methods that are well known to those of ordinary skill in the art such as, for example and without limitation, chemical vapor deposition.

Figures 6A, 6B:
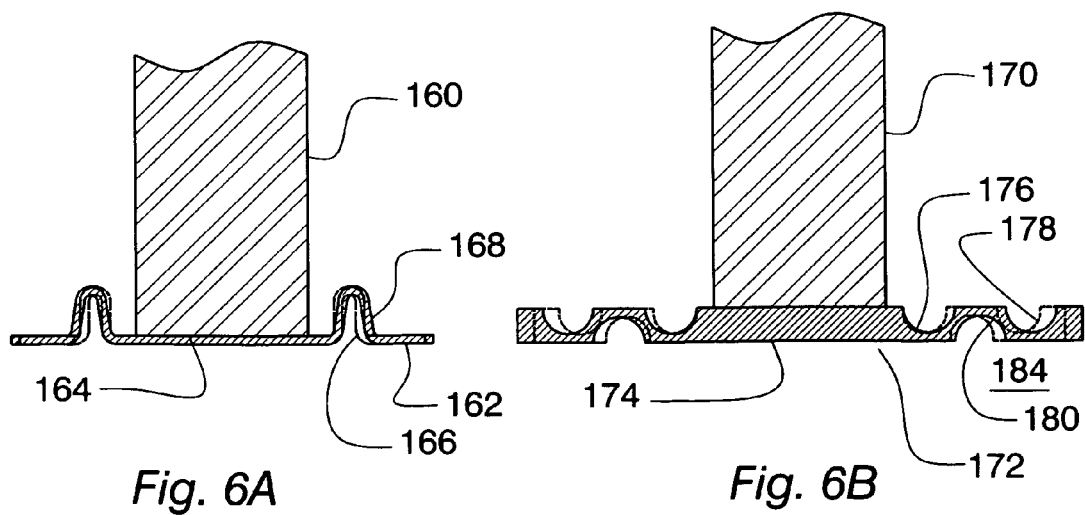
FIGS. 6A and 6B are cross sectional views of portions of apparatuses that are fabricated in accordance with one or more embodiments of the present invention showing mechanically resilient sections around thermally conductive segments that are affixed to thermally conductive posts.

FIGS. 6A and 6B are cross sectional views of portions of apparatus that are fabricated in accordance with one or more embodiments of the present invention showing mechanically resilient sections around thermally conductive segments affixed to thermally conductive posts. In particular, as shown in FIG. 6A, thermally conductive segment 164 of membrane 162 is permanently attached to thermally conductive post 160, such attachment may be provided using any one of a number of methods that are well known to those of ordinary skill in the art. In accordance with one or more embodiments of the present invention, resilient connection 168 is an undulation of membrane 162, wherein membrane 162 may be formed using any one of a number of methods that are well known to those of ordinary skill in the art such as, for example and without limitation, by plating nickel onto a temporary mandrel. In accordance with one or more such embodiments, slots in the mandrel may be used to form undulations in the plated membrane that provide resilient connections like resilient connection 168. Dashed line 166 in FIG. 6A shows the undulation in membrane 162 as initially formed, i.e., without membrane 162 being under tension, and the undulation identified as resilient connection 168 represents the undulation after membrane 162 is placed under tension. In accordance with one or more embodiments of the present invention, under tension, the undulation stretches to provide resilience in its connection between thermally conductive segment 164 and adjacent thermally conductive segments.

As shown in FIG. 6B, thermally conductive segment 174 of membrane 172 is permanently attached to thermally conductive post 170, such attachment may be provided using diffusion bonding or by using any one of a number of methods that are well known to those of ordinary skill in the art. In accordance with one or more embodiments of the present invention, resilient connection 184 is an undulation of membrane 172, wherein the undulations may be formed using any one of a number of methods that are well known to those of ordinary skill in the art such as, for example and without limitation, by cutting grooves in the surface of the membrane by embossing, by micro-machining, by laser machining, or by reactive ion etching. In accordance with one or more such embodiments, undulations, for example the undulations in resilient connection 184, may be formed by electrochemically etching grooves 176 and 178 into a top surface of membrane 172 and groove 180 into a bottom surface of membrane 172 in accordance with any one of a number of methods that are well known to those of ordinary skill in the art. In accordance with one or more embodiments of the present invention, grooves 176 and 178 are parallel to groove 180, and are displaced laterally therefrom to form an undulation in a surface of membrane 172. The dashed line in FIG. 6B represents the undulations in membrane 172 as initially formed, i.e., without membrane 172 being under tension, and the solid lines represent undulations after membrane 172 is placed in tension. In accordance with one or more embodiments of the present invention, under tension, undulation 184 stretches to provide resilience in its connection between thermally conductive segment 174 and adjacent thermally conductive segments.

Figure 7A:
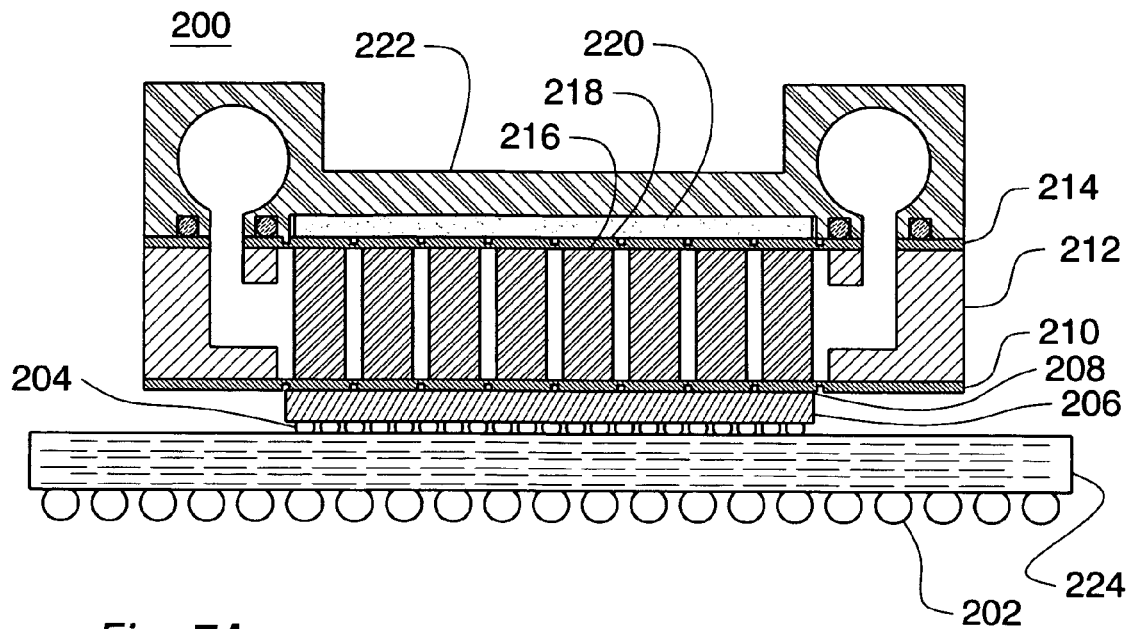
FIG. 7A is a cross sectional view of an arrangement useful in testing a high power microelectronic device which includes a mechanically compliant heat sink that is fabricated in accordance with one or more embodiments of the present invention where the microelectronic device is flat.
Figure 7B:
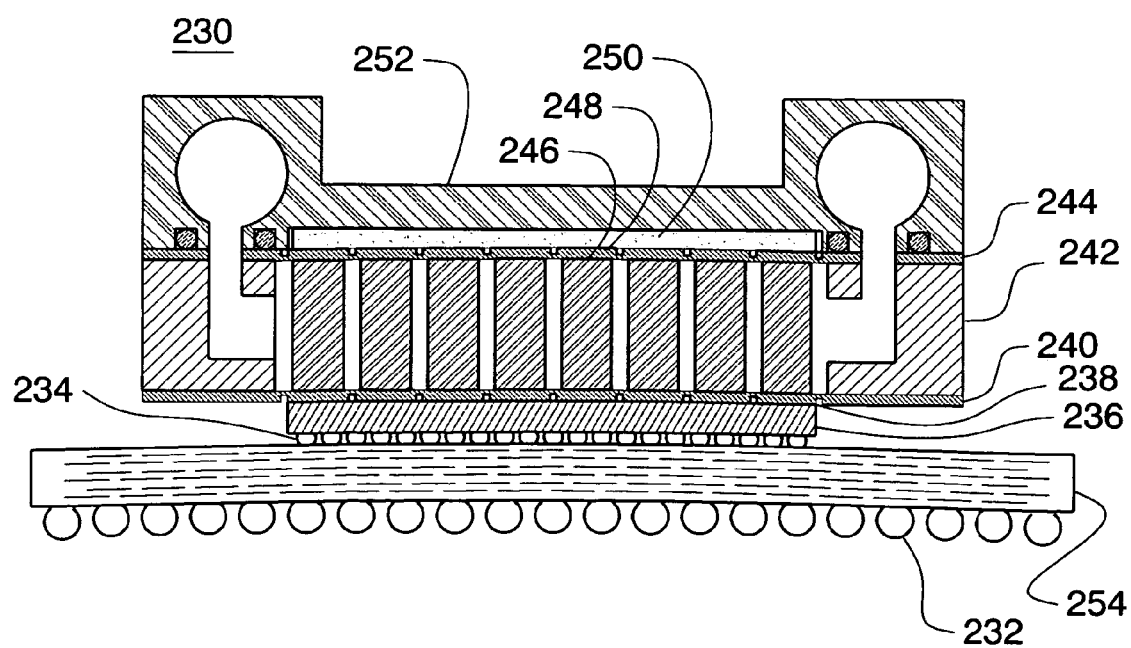
FIG. 7B shows a cross sectional view of the arrangement where the device is warped.

FIG. 7A is a cross sectional view of an arrangement useful in testing high power microelectronic device 206 that includes mechanically compliant heat sink 200 that is fabricated in accordance with one or more embodiments of the present invention where microelectronic device 206 is flat. As such, FIG. 7A shows mechanically compliant heat sink 200 in contact with an ideal microelectronic device 206. FIG. 7B shows a cross sectional view of the arrangement where microelectronic device 236 is warped. As such, FIG. 7B shows mechanically compliant heat sink 230 in contact with a warped and distorted microelectronic device 236.

As shown in FIG. 7A, microelectronic device 206 is attached to printed wiring substrate 200 by means of solder bumps 204. In addition, printed wiring substrate 224 has a ball grid array of contacts 202 on its bottom surface. In accordance with one or more embodiments of the present invention, a downward force applied to manifold 222 of mechanically compliant heat sink 200 urges membrane 210 into contact with a top surface of device 206 by transmitting the force through resilient pad 220, membrane 214, posts 216, and membrane 210. In accordance with one or more embodiments of the present invention, support ring 212 holds membranes 210 and 214 under tension while allowing them to move. Heat from device 206 is conducted through gap 208 between the top surface of device 206 and membrane 210, and into thermally conductive posts 216 where it is carried away by a cooling fluid flowing around and between the posts. Because gap 208 is very thin, its thermal resistance is small. In accordance with one or more embodiments of the present invention, the thermal resistance of gap 208 may be further reduced by filling gap 208 with helium, water, isopropyl alcohol, glycol, glycerin or other relatively conductive fluid materials in accordance with any one of a number of methods that are well known to those of ordinary skill in the art.

As shown in FIG. 7B, microelectronic device 236 is warped and is attached to printed wiring substrate 254 by means of solder balls 234. In this example, device 236 and printed wiring substrate 254 are warped. This is often caused by thermal stresses in printed wiring substrate 254 or by thermally induced stresses between device 236 and printed wiring substrate 254. In accordance with one or more embodiments of the present invention, membrane 240 compliantly bends to conform to the warped surface of device 236, thereby reducing gap 238 therebetween. As a result, good thermal contact is maintained between device 236 and mechanically compliant heat sink 230. In accordance with one or more embodiments of the present invention, the upwardly warped surface of device 236 causes compliant membrane 240 to distort upwardly, thereby increasing pressure on posts 246 in a center portion of mechanically compliant heat sink 230. In turn, posts 246 push upwardly on membrane 244, compressing resilient pad 250 against manifold 252. In accordance with one or more such embodiments, compression of resilient pad 250 allows membranes 240 and 244 and the array of posts 246 attached thereto to conform compliantly to fit the warped surface of device 236. In accordance with one or more embodiments of the present invention, support ring 242 holds membranes 244 and 240 in tension while allowing them to move to conform compliantly to the warped surface of device 236. As a result, and in accordance with one or more such embodiments, gap 238 between warped device 236 and compliant membrane 240 is reduced, and thermal conduction therebetween is increased. In accordance with one or more embodiments of the present invention, thermal resistance of gap 238 may be reduced by filling gap 238 with helium, water, isopropyl alcohol, glycol, glycerin or other relatively conductive fluid materials in accordance with any one of a number of methods that are well known to those of ordinary skill in the art.

Figure 8:
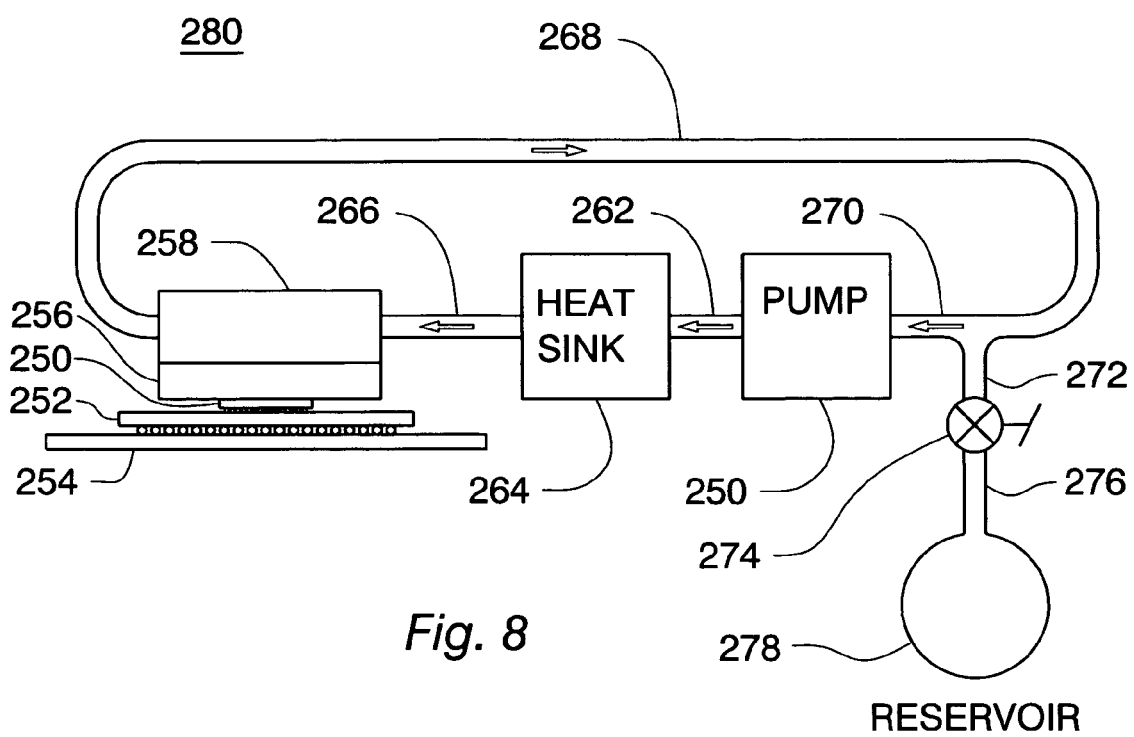
FIG. 8 shows a system that is fabricated in accordance with one or more embodiments of the present invention for cooling a microelectronic device such as a semiconductor chip.

FIG. 8 shows system 280 that is fabricated in accordance with one or more embodiments of the present invention for cooling high power microelectronic device 250. As shown in FIG. 8, device 250 is attached directly to mechanically compliant thermal heat sink 256 that is fabricated in accordance with one or more embodiments of the present invention. As further shown in FIG. 8, device 250 is mounted on daughter card 252 which is, in turn, attached to system board 254.

In operation, heat generated in device 250 is conducted through mechanically compliant thermal heat sink 256 to a cooling fluid flowing therethrough. The cooling fluid enters manifold 258 from a circulating system. Manifold 258 directs the cooling fluid to flow through mechanically compliant thermal heat sink 256. After being output from mechanically compliant thermal heat sink 256 and manifold 258, the cooling fluid flows through tubing 268 back to pump 250 where it is pressurized and fed through tubing 262 into heat sink 264 where heat is extracted therefrom. The cooling fluid is then fed through tubing 266 back to manifold 258. As shown in FIG. 8, reservoir 278 holds excess cooling fluid, and tubing 272 and 276 connect reservoir 278 to circulating fluid flow 270. In accordance with one or more such embodiments, valve 274 is activated to allow cooling fluid to flow into and out of reservoir 278. Operation of circulating cooling fluid systems is well known in the art, and such systems may be fabricated in accordance with any one of a number of methods that are well known to those of ordinary skill in the art. Further, in light of the detailed described provided herein, one of ordinary skill in the art can readily determine how such systems may be used in conjunction with mechanically compliant thermal heat sinks that are fabricated in accordance with one or more embodiments of the present invention.

In normal operation of system 280, microelectronic device 250 will undergo cycles of heating and cooling that induce mechanical expansion, warpage and movement of device 250. In accordance with one or more embodiments of the present invention, compliance of mechanically compliant thermal heat sink 256 accommodates these mechanical distortions without impairing thermal contact between heat sink 256 and device 250.

The embodiments of the present invention described above are exemplary. Many changes and modifications may be made to the disclosure recited above while remaining within the scope of the invention. For example, although the specification has described embodiments wherein resilient connections between conductive segments of a membrane where embodied in the form of undulating links, further embodiments of the present invention are not limited to the use of undulating links. In fact, it is within the scope of the present invention that further embodiments exist wherein resilient connections may be embodied in any number of forms such as, without limitation, in any manner of producing a resilient connection. For example, a resilient connection may be fabricated as a spring member. In addition, although above-described embodiments have related to cooling of microelectronic devices, such devices may be heated if the circulating fluid were heated. In such a case, the above-described embodiments could be used to transfer heat to microelectronic devices. In further addition, in accordance with one or more embodiments, the top membrane may not comprise thermally conductive segments and mechanically resilient connections disposed between the thermally conductive segments. In fact, one or more such embodiments include the top membrane being replaced by a solid block. For example, in accordance with one or more such embodiments, the ring structure may have one side being solid so that that side would serve as the solid block. The scope of the invention should therefore be determined not with reference to the above description, but instead should be determined with reference to the appended claims along with their full scope of equivalents.

What is claimed is:

1. Apparatus for cooling a microelectronic device comprising:

a rigid support ring having a bottom surface;

a mechanically resilient, thermally conductive bottom membrane having a top and a bottom surface, wherein the top surface of the membrane is attached to the bottom surface of the ring;

a top member with a bottom surface forming a sealed chamber enclosed by the top surface of the bottom membrane, the support ring, and the bottom surface of the top member;

a first aperture for introducing cooling fluid into the chamber;

a second aperture for withdrawing cooling fluid from the chamber; and a multiplicity of thermally conductive posts having top and bottom surfaces, the posts being attached at their bottom surfaces to the top surface of the bottom membrane and at their top surfaces to the bottom surface of the top member, wherein the posts are arrayed with spaces therebetween so that heat transferred from the microelectronic device to the bottom surface of the membrane may be transferred to the multiplicity of thermally conductive posts.

2. The apparatus of claim 1 wherein the bottom membrane comprises thermally conductive segments and mechanically resilient connections disposed between the thermally conductive segments.

3. The apparatus of claim 2 wherein the thermally conductive posts are attached to the thermally conductive segments.

4. The apparatus of claim 3 wherein the bottom membrane is attached so that it is held under tension by the support ring such that a macroscopic coefficient of thermal expansion (CTE) of the membrane is substantially the same as a CTE of the support ring.

5. The apparatus of claim 4 wherein the mechanically resilient connections comprise undulatory springs.

6. The apparatus of claim 3 wherein the support ring is made of a material having a CTE in a range between about 0.0 parts per million per degree Centigrade and about 8 parts per million per degree Centigrade.

7. The apparatus of claim 3 wherein the support ring includes passages that direct a cooling fluid to contact the multiplicity of thermally conductive posts.

8. The apparatus of claim 1 wherein:
the top member is mechanically resilient and is attached to a top surface of the support ring.

9. The apparatus of claim 4 wherein one or more of the posts is a circular cylinder.

10. The apparatus of claim 4 wherein one or more of the posts is a tube having slots cut through a wall of the tube along a length of the tube.

11. The apparatus of claim 4 wherein one or more of the posts comprises several columns joined to a flat portion.

12. The apparatus of claim 4 wherein one or more of the posts includes a spring comprising one or more helical grooves in the one or more posts.

13. A microelectronic assembly adapted for cooling using a circulating fluid comprising:
a semiconductor chip;
a rigid support ring having a bottom surface;
a mechanically resilient, thermally conductive membrane having a top and a bottom surface, the top surface being attached to the bottom surface of the support ring, wherein the membrane is comprised of thermally conductive attachment areas and mechanically resilient connection elements disposed between the attachment areas;
a top member with a bottom surface forming a sealed chamber enclosed by the top surface of the membrane, the support ring, and the bottom surface of the top member;
a first aperture for introducing the fluid into the chamber;
a second aperture for withdrawing the fluid from the chamber;
a multiplicity of thermally conductive posts having top and bottom surfaces, the posts being disposed in an array wherein the bottom surface of each of the thermally conductive posts is attached to an attachment area on the top surface of the bottom membrane and wherein the top surface of each of the posts is attached to the bottom surface of the top member; and wherein the bottom surface of the membrane is attached to the semiconductor chip by a thermally conductive material so that heat transferred from the microelectronic device to the bottom surface of the membrane may be transferred to the multiplicity of thermally conductive posts.

14. The apparatus of claim 2 wherein one or more of the mechanically resilient connections comprises alternating channels formed in the top and bottom surfaces of the membrane such that centerlines of the channels in the top surface are offset in a perpendicular direction from channels in the bottom surface.

15. The apparatus of claim 2 wherein one or more of the mechanically resilient connections comprises an indentation formed in the bottom surface of the membrane such that a centerline of the indentation lies between the thermally conductive segments adjacent to the indentation.

16. The apparatus of in claim 4 wherein the support ring is comprised of a material selected from a group including invar, kovar, tungsten, tungsten alloys, nickel-iron alloys, and silicon.

17. The apparatus of claim 13 wherein the thermally conductive material comprises a layer of low melting alloy disposed between the membrane and the semiconductor chip in areas opposite to the attachment areas.

18. Apparatus for cooling a semiconductor chip comprising:
a ring support formed of a material having a low coefficient of thermal expansion and the ring support having a bottom surface;
a membrane having a top and a bottom surface which comprises an array of thermally conductive segments and resilient connections between the segments, wherein: (a) each segment has a top and a bottom surface, (b) the bottom surfaces of the segments are flat and coplanar, and (c) each segment has a lateral dimension smaller than a corresponding lateral dimension of the semiconductor chip;
a top member with a bottom surface forming a sealed chamber enclosed by the top surface of the membrane, the ring support, and the bottom surface of the top member;
a first aperture for introducing cooling fluid into the chamber;
a second aperture for withdrawing cooling fluid from the chamber; and
a multiplicity of thermally conductive posts having top and bottom surfaces, the posts being attached at their bottom surfaces to the top surfaces of the segments of the membrane and at their top surfaces to the bottom surface of the top member, wherein the posts are arrayed with spaces therebetween so that heat transferred from the microelectronic device to the bottom surface of the membrane may be transferred to the multiplicity of thermally conductive posts; and
wherein the membrane is held in tension by attachment to a bottom surface of the ring support such that a coefficient of thermal expansion measured between centers of the segments is substantially the same as the coefficient of expansion of the ring.

19. The apparatus of claim 18 wherein one or more of the resilient connections comprises a narrow strip of the membrane in which one or more grooves in the top surface are parallel to one or more grooves in the bottom surface.

20. The apparatus of claim 18 wherein one or more of the resilient connections comprises an upward undulation in the membrane between segments.

21. The apparatus of claim 18 wherein the lateral dimension of each of said segments is less than 25% of the lateral dimension of the semiconductor chip.

22. The apparatus of claim 18 wherein the low expansion material is selected from a group including invar, kovar, tungsten, molybdenum, aluminum nitride, glass ceramic, aluminum oxide, and nickel-iron alloys.

23. The apparatus of claim 18 wherein the membrane is made of material selected from a group including beryllium-copper, coin silver, bronze, phosphor-bronze, silver plated beryllium-copper, and copper alloys.

* * * * *